US008609206B2

(12) United States Patent
Seleznev

(10) Patent No.: US 8,609,206 B2
(45) Date of Patent: Dec. 17, 2013

(54) CONTINUOUS OR DISCRETE METALLIZATION LAYER ON A CERAMIC SUBSTRATE

(76) Inventor: Maxim Seleznev, Belmont, MA (US)

( * ) Notice: Subject to any disclaimer, the term of this patent is extended or adjusted under 35 U.S.C. 154(b) by 283 days.

(21) Appl. No.: 12/990,595

(22) PCT Filed: Apr. 30, 2009

(86) PCT No.: PCT/US2009/002724
§ 371 (c)(1),
(2), (4) Date: Nov. 1, 2010

(87) PCT Pub. No.: WO2009/134448
PCT Pub. Date: Nov. 5, 2009

(65) Prior Publication Data
US 2011/0045209 A1    Feb. 24, 2011

Related U.S. Application Data

(60) Provisional application No. 61/126,158, filed on May 1, 2008.

(51) Int. Cl.
| | | |
|---|---|---|
| *C23C 14/14* | (2006.01) | |
| *C23C 16/00* | (2006.01) | |
| *B05D 5/06* | (2006.01) | |
| *B05B 3/00* | (2006.01) | |
| *H05B 6/02* | (2006.01) | |
| *F27B 14/00* | (2006.01) | |
| *C21D 5/00* | (2006.01) | |
| *C21D 9/00* | (2006.01) | |

(52) U.S. Cl.
USPC ........... 427/597; 427/543; 427/546; 427/591; 427/592; 432/13; 148/512; 148/559

(58) Field of Classification Search
USPC ......... 148/512, 559, 579, 674, 675, 678, 679, 148/565; 428/546, 548, 544, 551, 552, 553, 428/615; 427/597, 535, 546, 543, 591, 592, 427/541, 542
See application file for complete search history.

(56) References Cited

U.S. PATENT DOCUMENTS

| | | | | |
|---|---|---|---|---|
| 4,486,464 A | * | 12/1984 | Young | 427/63 |
| 4,836,982 A | | 6/1989 | Brupbacher | |
| 5,202,059 A | | 4/1993 | Kennedy | |
| 5,352,522 A | | 10/1994 | Kugimiya | |
| 5,486,427 A | * | 1/1996 | Koskenmaki et al. | 428/546 |

(Continued)

OTHER PUBLICATIONS

Ravishankar et al., "Glass and metals on crystalline oxides," Journal of the European Ceramic Society, Jun. 16, 2009, 2777-2785, vol. 23.

*Primary Examiner* — Michael Wieczorek
(74) *Attorney, Agent, or Firm* — Bay State IP, LLC

(57) ABSTRACT

Surface metallization technology for ceramic substrates is disclosed herein. It makes use of a known phenomenon that many metal—metal oxide alloys in liquid state readily wet an oxide ceramic surface and strongly bond to it upon solidification. To achieve high adhesion strength of a metallization to ceramic, a discrete metallization layer consisting of metal droplets bonded to ceramic surface using metal—metal oxide bonding process is produced first. Next, a continuous metal layer is deposited on top of the discrete layer and bonded to it using a sintering process. As a result a strongly adhering, glass-free metallization layer directly bonded to ceramic surface is produced. In particular, the process can be successfully used to metalize aluminum nitride ceramic with high thermal and electrical conductivity copper metal.

16 Claims, 6 Drawing Sheets

(56) References Cited

U.S. PATENT DOCUMENTS

| | | | |
|---|---|---|---|
| 5,795,849 A * | 8/1998 | Hickman | 505/329 |
| 6,123,797 A | 9/2000 | Pyzik | |
| 6,541,136 B1 * | 4/2003 | Kwon et al. | 428/701 |
| 2007/0232482 A1 | 10/2007 | Bowe | |

* cited by examiner

CONTINUOUS OR DISCRETE METALLIZATION LAYER ON A CERAMIC SUBSTRATE

CROSS REFERENCE TO RELATED APPLICATIONS

This application is for entry into the U.S. National Phase under §371 for International Application No. PCT/US2009/002724 having an international filing date of Apr. 30, 2009, and from which priority is claimed under all applicable sections of Title 35 of the United States Code including, but not limited to, Sections 120, 363 and 365(c), and which in turn claims priority under 35 USC 119 to U.S. Patent Application No. 61/126,158 filed on May 1, 2008.

FEDERALLY SPONSORED RESEARCH

Not Applicable

SEQUENCE LISTING OR PROGRAM

Not Applicable

FIELD OF THE INVENTION

This invention relates to processing method to manufacture metallized ceramic substrates for electronic packaging applications.

BACKGROUND OF THE INVENTION

Metallized ceramic substrates find wide usage for electronic packaging applications, exemplary of which are high density DC/DC converters, power amplifiers, RF circuitry and high current switches. These metallized ceramic substrates take advantage of the electrical conductivities of certain metals and the good thermal conductivities, mechanical strength properties and low electrical conductivities of ceramics. Aluminum nitride (AlN) metallized with copper is particularly favored for advanced applications because of the relatively high oxidation resistance in combination with excellent electrical conductivity of copper and the high thermal conductivity of aluminum nitride.

The state-of-the-art to date in metallizing ceramic substrates consists of either screen-printing usually precious metal inks on the ceramic substrate or depositing very thin layers of vacuum deposited metallization to form the conductive circuit patterns. Both techniques are costly. However, a very large market has developed demanding both less expensive methods and more efficient circuitry.

A thin film circuit on ceramic typically consists of a thin film of metal deposited on a ceramic substrate by one of the vacuum deposition techniques. In these techniques, generally a chromium or molybdenum film, having a thickness of about 0.02 micrometers, acts as a bonding agent for copper or gold layers. Photolithography is used to produce high-resolution patterns by etching away the excess thin metal film. Such conductive patterns may be electroplated up to, typically, 7 micrometers thick. However, due to their high costs, thin film circuits have been limited to specialized applications such as high frequency and military applications where a high pattern resolution is vital.

Another method of producing printed circuits is known as the thick film method. A thick film printed circuit comprises a conductor pattern consisting of a metal, such as silver or gold, and glass frit and/or metal oxide particles fired on a ceramic substrate. Typically, the film has a thickness of about 15 micrometers. Thick film circuits have been widely used and are produced by screen-printing of a circuit pattern with a paste containing the conductive metal powder and a glass fit and/or metal oxide particles in an organic carrier. After printing, the ceramic parts are fired in a furnace to burn off the carrier, sinter the conductive metal particles and fuse the glass. These conductors are firmly bonded to the ceramic by the glass and thus components may be attached to the conductors by soldering, wire bonding and the like.

A disadvantage in using thick film printed circuits is that the conductors have only a 30 to 60 percent of the conductivity of the pure metal. Another disadvantage of thick film technology is that it cannot be applied to aluminum nitride substrates because of a close to zero adhesion of glass to aluminum nitride. In general, there is a need for the higher electric and thermal conductivity attainable by pure metal and aluminum nitride in order to provide the necessary conductive paths for higher density circuits or greater power carrying and thermal dissipation capabilities.

Attempts also have been made in the past to directly bond pure metal conductors to ceramic substrates including alumina, beryllia and aluminum nitride in order to achieve higher conductivity for ceramic-based circuit patterns. See, for example, D. A. Cusano et. al. U.S. Pat. No. 3,994,430 and G. L. Babcock et. al. U.S. Pat. No. 3,766,634 and K. W. Paik et. al. U.S. Pat. No. 5,418,002, which generally describe a process, according to which an oxidized copper foil is juxtaposed on a preconditioned (mostly through surface oxidization) ceramic substrate and heat-bonded thereto utilizing a copper-copper oxide eutectic that is formed during the bonding process at temperatures between 1065 and 1075 degrees Celsius. However, this method suffers from many technological problems, most serious of which is entrapment of gases that cause blistering between the metal layer and the substrate leading to poor yields and high production costs. Also, in order to produce a well-adhered copper foil with minimum blisters, the process parameters have to be controlled very closely, which is hard to do under commercial operating conditions Other methods tried in attempt to produce reliable metallization of ceramics with pure metal conductors, such as copper, were disclosed in a series of patents and proposed processes that utilize electroless deposition of an initial conductive metal layer onto the ceramic substrate. U.S. Pat. No. 3,690,921 to Elmore involves the use of molten sodium hydroxide to etch a ceramic surface. In this process, following etching the sodium hydroxide is rinsed from the ceramic surface with water, the ceramic surface neutralized with dilute sulfuric acid and rinsed again before sensitizing with a stannous chloride solution, rinsing and seeding with a palladium chloride solution, to catalyze the surface for electroless metal plating. Although the process of Elmore provides good surface coverage it reached only limited acceptance for commercial production because of low adhesion, primarily because the alkaline surface treatment weakens the ceramic surface structure. U.S. Pat. No. 4,428,986 to Schachameyer discloses a method for direct autocatalytic plating of a metal film on a beryllia substrate. However, the method of this patent was able to achieve only 1.7 MPa bond strength. This bond strength is too low for practical use.

Therefore, prior art processes suffer from high costs, or low electrical and thermal performance of metallization layer, or high rejection rate due to blister-prone substrates, or unacceptably low metallization bond strength and are in general unsatisfactory for commercial product purposes. However, it is desirable for economic and increased circuit density design capability reasons to have metallization adhesion to the substrate that will withstand subsequent technological operations and thermal cycling during substrate use as a part of electronic package. Previous attempts to reproducibly manufacture metallized ceramic substrates, particularly aluminum nitride, only experienced limited success. However, the present invention satisfies the foregoing desires by providing a high thermal and electrical conductivity metal layer having excellent adhesion to ceramic surface. In addition, newly invented process provides the following advantages over the prior art, namely (1) it allows to obtain metallization layer thickness, which can be controllably varied in a wide range from a few micro meters to a few hundreds of micrometers; (2) it allows utilizing thick film printing as a process step where inks without glass or oxide fillers are used resulting in better conductive and thermal properties of thick film metallization layer; (3) it enables metallization of not only planar surfaces, but curved surfaces as-well; (4) it results in a high manufacturing yields of metallized ceramic; (5) it provides an economical way to enable soldering or brazing to the metallized ceramic; (6) it provides an inexpensive way to form micro-pins on ceramic surface for enhanced gas or liquid heat transfer applications.

SUMMARY OF THE INVENTION

Surface metallization technology for ceramic substrates is disclosed herein. It makes use of a known phenomenon that many metal-metal oxide alloys in liquid state readily wet an oxide ceramic surface and strongly bond to it upon solidification. To achieve high adhesion strength of a metallization to ceramic, a discrete metallization layer consisting of metal droplets bonded to ceramic surface using metal-metal oxide bonding process is produced first. Next, a continuous metal layer is deposited on top of the discrete layer and bonded to it using a sintering process. As a result a strongly adhering, glass-free metallization layer directly bonded to ceramic surface is produced. In particular, the process can be successfully used to metallize aluminum nitride ceramic with high thermal and electrical conductivity copper metal.

DETAILED DESCRIPTION OF THE INVENTION

A number of preferred embodiments of the invention are described below. The invented process includes several steps in its operation.

Ceramic Oxidation Step

In a preferred embodiment a commercial AlN substrate with thermal conductivity specified at 170 W/mK, is first subjected to surface oxidation treatment. The oxidation treatment is preferably done according to regime specified in U.S. Pat. No. 5,150,830, at temperatures in the range between 1000 and 1500 degrees C. for duration between 30 hours at lower temperature to 5 minutes at higher temperature in atmosphere of 99.95% or higher purity oxygen. The oxidation treatment produces an even and strong aluminum oxide layer at the substrate surface in a thickness range of 1.5 to 2.5 micrometers.

In other embodiments of the invention, an oxide, spinel or other oxygen-containing, meaning containing oxygen as a substantial component of chemical composition, ceramic substrate can be used as a substrate without oxidizing treatment. Examples include, but not limited to, alumina, black alumina, beryllia, silica-based glass, silica-based ceramic, zirconia, magnesia, mullite, corderite, fosterite, borosilicate, the main requirement to such ceramic being that it withstands exposure to 1100 degrees C. temperature without softening or decomposition.

In other embodiments of the invention, oxygen-non-containing, meaning not containing oxygen as a substantial component of chemical composition, ceramic substrates capable of withstanding exposure to 1100 degrees C. temperature can be used for the process, but like aluminum nitride, they have to be subjected to surface oxidation treatment. Examples include, but not limited to silicon nitride, boron nitride, silicon, silicon carbide, titanium carbide, boron carbide.

Deposition of Precursor Metal Coating Step

Figure 1:
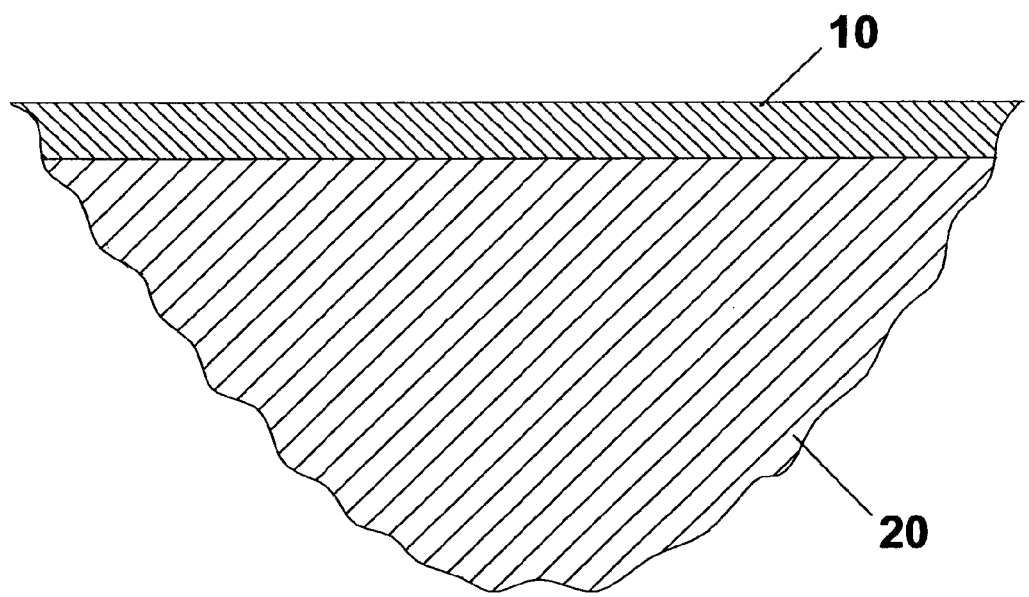
FIG. 1 is a schematic crossection view of a ceramic surface fragment with copper coating applied to the ceramic surface.

In a preferred embodiment, after the oxidized AlN substrate 20 (FIG. 1) is obtained, it is coated with a layer 10 of precursor metal coating. The precursor coating does not have to adhere strongly to the ceramic substrate, nor has it to be a solid crystalline layer. The coating can consist of metal particles, but it has to be substantially continuous, meaning continuous in comparison with the size of the particles thereof, and nominally adhere to the ceramic substrate, so that if the substrate is turned coated face down, the precursor coating does not fall off under gravity force.

In one preferred embodiment, after an oxidized AlN substrate is obtained, a preferably 1 micron thick precursor copper coating is deposited on it by a thermal evaporation method known to persons skilled in the art.

Alternatively other process or combination of processes, could be used to produce the precursor metal coating on the ceramic substrate, including, but not limited to physical vapor deposition, chemical vapor deposition, kinetic spray, thermal spray, thick film printing, ink jet printing, electroless plating, electrolytic plating, slurry dipping, slurry spraying, slurry brushing, automated syringe or nozzle dispensing, laser cladding etc.

In another preferred embodiment, after the oxidized AlN substrate is obtained, it is coated with a preferably 1-3 micron thick precursor copper coating by using a kinetic powder spray apparatus described in U.S. Pat. No. 6,402,050. In this preferred embodiment a supersonic jet of gas, preferably air, heated to temperature of 200 degrees C., is formed by means of pushing a heated and pressurized gas, preferably air, through a De Laval converging-diverging nozzle, and injecting metal powder, preferably copper, having average particle size of preferably 20 microns, but not larger than 50 microns in any dimension, into the supersonic air jet, so that the metal powder particles acquire supersonic velocity and the gas jet temperature. Unlike classic powder spraying gas-dynamic apparatus configuration described in U.S. Pat. No. 5,302,414, that forms a mixture of gas and powder before it enters a converging-diverging nozzle that imparts supersonic velocity to the mixture, configuration described in U.S. Pat. No. 6,402,050 allows avoiding an aggressive erosion and blockage of the nozzle and simplifies powder feeding. Other parameters of the deposition process, such as linear scanning speed, jet nozzle to substrate surface height offsets and scanning line overlap should be typical for gas-dynamic powder deposition methods and are known to persons skilled in the art.

Discretization of Precursor Metal Coating Step

Figure 2:
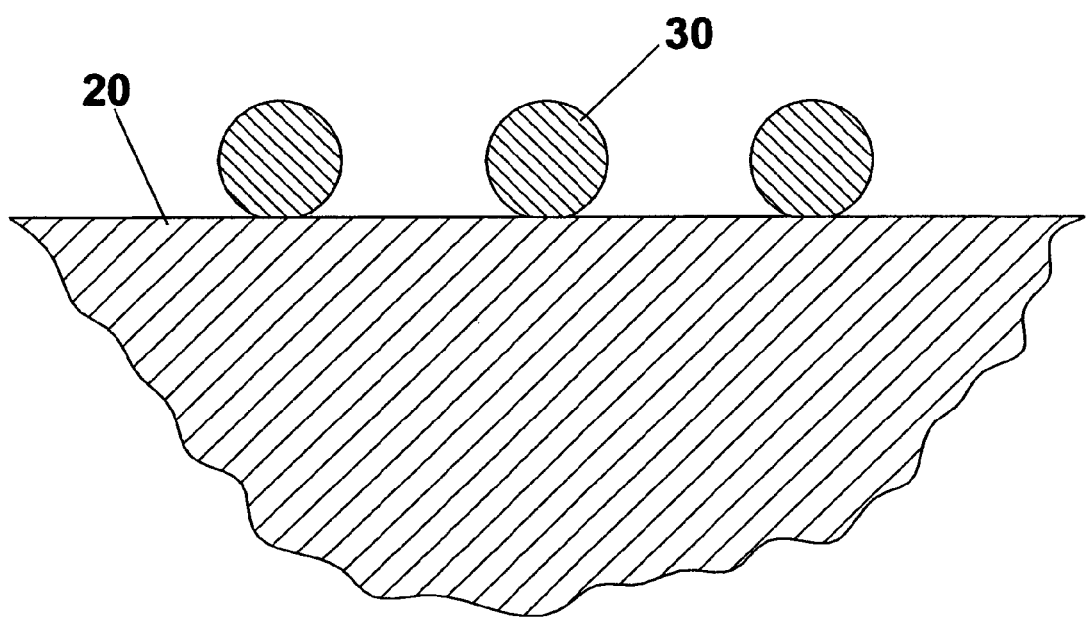
FIG. 2 is a schematic crossection view of a ceramic surface fragment with dome-shaped droplets of liquid copper formed on ceramic surface.

In a preferred embodiment, following deposition of the precursor copper coating on surface-oxidized AlN substrate, ceramic 20 with applied copper layer 10 is subjected to heat treatment in a controlled atmosphere furnace. Heat treatment takes place in an inert atmosphere, like dry pure nitrogen, argon, etc. Inert gas flows through the furnace at a rate, sufficient to preclude substantially any oxygen from entering the furnace atmosphere. Furnace temperature is ramped up from room temperature to a value over 1085° C., preferably between 1090 degrees C. and stabilized at that level for a period of time, preferably 15 minutes. During that time period precursor copper coating melts and breaks down to form a random array of liquid droplets 30 on the ceramic surface 20 (FIG. 2). Liquid droplets 30 (FIG. 2) are represented schematically as having the same size, while in reality the droplets size varies. Average droplet diameter and droplet-to-droplet distance scales with the thickness of precursor copper coating deposited on ceramic surface in the previous step. The liquid droplets take a dome shape, with contact angle substantially lower than 90 degrees. Such contact angle of copper droplets on ceramic surface is caused by a non-wetting of the ceramic surface by liquid copper.

Figure 3:
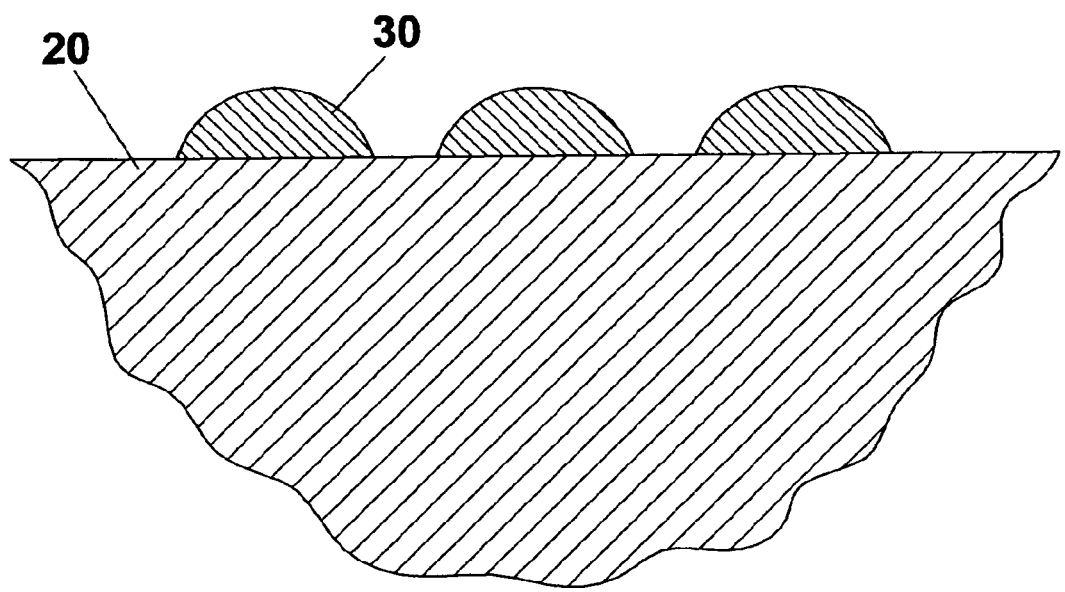
FIG. 3 is a schematic crossection view of a ceramic surface fragment with spherical cap shaped liquid copper droplets formed on ceramic surface.

Next, in a preferred embodiment, pure oxygen gas is introduced into the inert gas entering the furnace. Concentration of oxygen in the inert gas entering the furnace is set at preferably 50 ppm. Oxygen from the furnace atmosphere dissolves in the liquid copper and causes it to wet the ceramic, so that the liquid copper droplets shape changes from a dome to a spherical cap 40 (FIG. 3) with contact angle substantially lower than 90 degrees, which is characteristic of a good wetting.

The phenomenon of enhanced wetting is based on alloying of the liquid metal with a chemical species which causes a reaction with the substrate to form a layer of reaction product which is better wetted by the metal. This method of enhancing wetting of ceramic by a liquid metal is well known to persons skilled in the art, see for example Yu. Naidich, *Progress in Surface and Membrane Science*, 14, 353 (1981); M. Nicholas, *Br. Ceram. Trans. J.*, 85, 144 (1986); R. Loehman et al, *Am. Ceram. Bull*, 67, 375 (1988); K. Nogi, *Trans JWRI*, 22, 83 (1993). In a preferred embodiment the liquid metal is copper and chemical species by which the meal is alloyed is oxygen. However, in other preferred embodiments other metals, in which oxygen dissolves readily, when these metals are in a liquid state, can be made to wet ceramics better, and therefore can be used for precursor metal coating, for example nickel, cobalt, iron, manganese and chromium.

Next, in a preferred embodiment, after some period of time starting from the moment of introduction of oxygen into the furnace atmosphere, preferably after 10 minutes, temperature in the furnace is ramped down. After temperature passes 1060 degrees C. on its way down, which temperature corresponds to copper-copper oxide eutectic temperature, the flow of oxygen to the furnace is cut off. Spherical cap copper droplets solidify and stay well adhered to ceramic surface. After furnace temperature reaches 100 degrees C. or below, ceramic substrate is extracted from the furnace.

Alternatively, after melting and breaking down of the copper layer into dome droplets with contact angle substantially higher than 90 degrees at the temperature over 1085 degrees C., furnace temperature is reduced to a value between 1060 and 1080 degrees C., preferably 1070 degrees C. and held steady, at which point oxygen gas is introduced into the inert gas entering the furnace at concentration preferably 50 ppm, for a duration of time, preferably 10 minutes. Oxygen in furnace atmosphere dissolves in copper and forms copper-copper oxide liquid eutectic, which wets the ceramic surface. Wetting causes a transformation of the copper dome droplets into spherical cap droplets with contact angle substantially lower than 90 degrees on ceramic surface. After the said duration of time is over, the flow of oxygen is cut off, and ceramic substrate is cooled down to temperature below 50 C, at which point the ceramic can be extracted from the furnace.

In another embodiment, after melting and breaking down of the copper layer into the dome droplets with contact angle substantially higher than 90 degrees at the temperature over 1085 degrees C., oxygen gas at the concentration preferably 50 ppm, is introduced into inert gas entering the furnace concurrently with gradual furnace temperature reduction from a value over 1085 degrees to 1060 degrees C., said gradual temperature reduction performed for a duration of time, preferably 15 minutes, at which point the oxygen flow is cut off, and the furnace cooled down to a temperature below 50 C, at which point the ceramic can be extracted from the furnace.

Deposition of Final Metallization Coating Step

Figure 4:
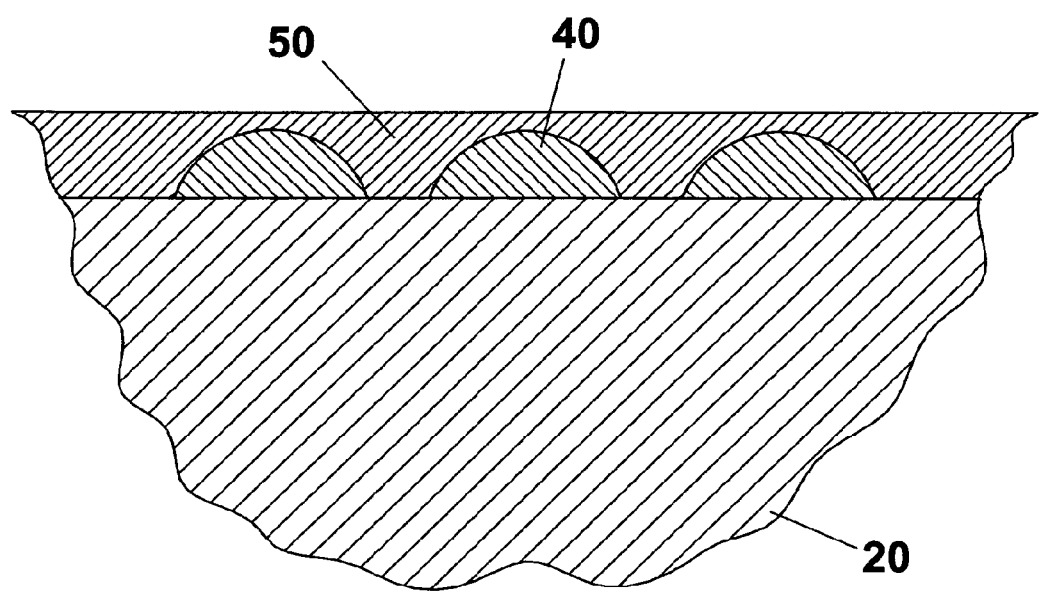
FIG. 4 is a schematic crossection view of a ceramic surface fragment with spherical cap shaped solidified copper droplets completely covered with layer of copper applied to the ceramic surface.

Next, in a preferred embodiment, a final metallization copper coating 50 (FIG. 4) is applied to the ceramic surface to cover the well-adhered solidified spherical cap droplets 40 of copper formed on ceramic surface in the previous process steps. Preferably the copper layer is produced using a thick film screen printing method known to persons skilled in the art.

Alternatively other process or combination of processes can be used to deposit a final metallization coating, such methods include, but not limited to physical vapor deposition, chemical vapor deposition, kinetic spray, thermal spray, thick film printing, ink jet printing, electroless plating, electrolytic plating, slurry dipping, slurry spraying, slurry brushing etc.

In another embodiment the final metallization copper coating is produced using a gas-dynamic powder spray apparatus described in U.S. Pat. No. 6,402,050.

Figure 5:
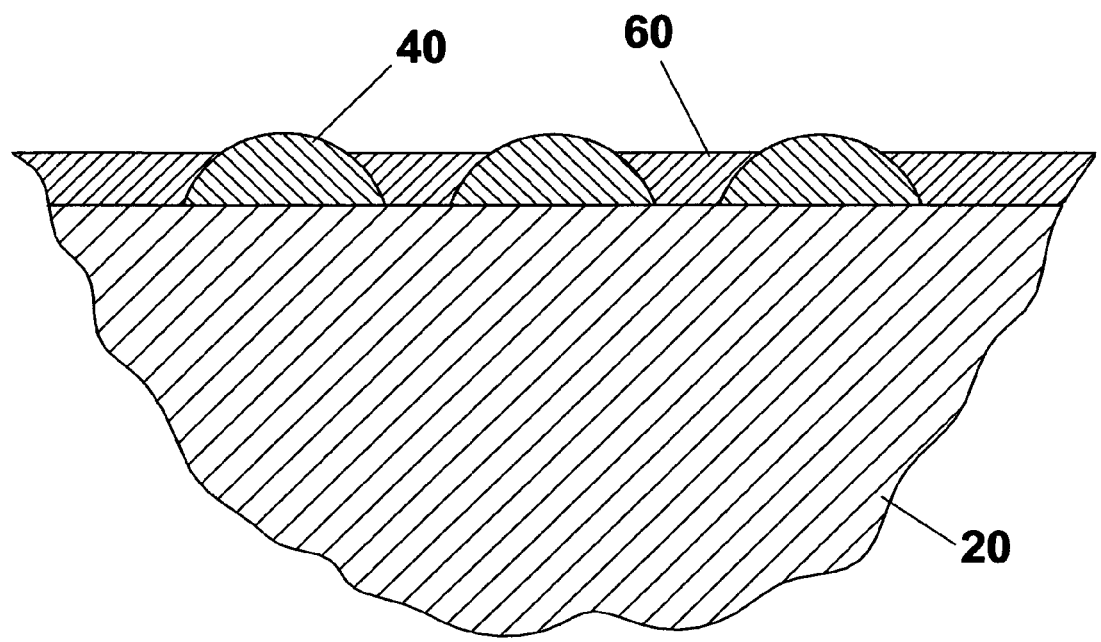
FIG. 5 is a schematic crossection view of a ceramic surface fragment with spherical cap shaped solidified copper droplets partially covered with layer of copper applied to the ceramic surface.

Alternatively copper layer 60 (FIG. 5) with thickness less than the height of droplets 40 can be applied, and if the resulting surface roughness of the coating is not adequate, the surface of the coating can be lapped or ground at a later stage.

Figure 6:
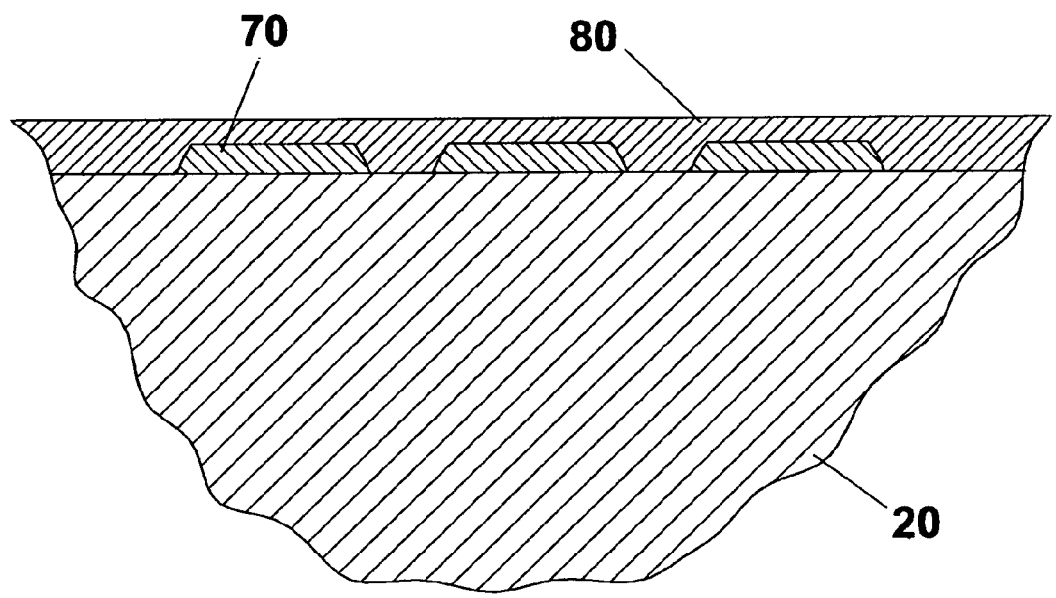
FIG. 6 is a schematic crossection view of a ceramic surface fragment with spherical cap shaped solidified copper droplets ground down and completely covered with layer of copper applied to the ceramic surface.

Alternatively, surface of the ceramic substrate with the well-adhered solidified spherical cap copper droplets can be mechanically lapped or chemically polished, so that the droplets are reduced to flat islands 70 (FIG. 6) on the ceramic surface. Than final metallization coating 80 can be applied just thick enough to cover the islands.

Sintering of Final Metallization Coating Step

Next, in a preferred embodiment, copper layer applied in the previous process step is sintered to the solidified copper droplets or islands on ceramic surface that it covers. To achieve this objective, the ceramic substrate is heat treated in dry inert atmosphere, preferably pure dry nitrogen. Furnace temperature is ramped up to between 800 and 1000 degrees C., preferably 900 C, and maintained at constant temperature for duration of time, preferably 30 minutes, and then ramped down to 100 degrees C., at which point the ceramic can be extracted from the furnace. As a result, copper layer deposited over well-adhered solidified copper droplets formed in the previous steps becomes strongly sintered to the droplets and therefore strongly attached to the ceramic surface.

Copper metallization resulting from the process steps described above can be lapped, ground or electrochemically polished to achieve desired surface roughness or thickness of metallization layer. To increase the layer thickness an additional thick film printing or electrolytic or electroless plating process can be employed.

Alternatively, copper coatings deposited in the Deposition of Precursor Metal Coating and Deposition of Final Metallization Coating processes steps can be deposited on ceramic surface as matching patterns.

Alternatively, copper coating deposited in the Deposition of Precursor Metal Coating step, can be deposited over the entire ceramic substrate surface, and copper layer in the Deposition of Final Metallization Coating step can be deposited as a pattern. Solidified spherical cap copper droplets not covered by the second patterned copper coating can be removed using chemical etching, since the droplets will etch at accelerated rates compared to a solid layer.

In another preferred embodiment, after forming well-adhered solidified copper droplets on the ceramic surface in the Discretization of Precursor Metal Coating process step, no further processing is applied. In that case the process results in formation of a discrete surface metallization coating on ceramic. The coating does not conduct electric current, however, it can be used for soldering or brazing to the ceramic, since solder or braze will in most cases wet the discretely metallized ceramic surface. To reduce the discrete metallization layer surface roughness, if needed, the metallized ceramic substrate can be lapped, so that well-adhered solidified copper droplets on ceramic surface are reduced to flat islands.

Alternatively, large (over 100 micrometers high) well-adhered solidified copper droplets on ceramic surface can be produced, without any further processing. Large size of the solidified copper droplets can be achieved through depositing thick (50 micrometers or thicker) copper layer in the Deposition of Precursor Metal Coating step of the process. The large solidified copper droplets strongly attached to the ceramic surface can be used as micro-pins to enhance gas or liquid heat transfer to ceramic in forced gas convection or micro-fluidics heat dissipation applications.

Alternatively a conveyor or pusher atmosphere furnace with more than one temperature and atmosphere zones can be used in the process instead of a batch furnace.

An article of manufacture comprising ceramic substrate metallized using the process described herein can be designed and built by a person skilled in the art.

The product and process of the invention will now be described with reference to the following non-limitative examples.

EXAMPLE 1

Approximately 50 by 50 by 0.65 mm AlN substrate available commercially, with specified thermal conductivity of 170 W/mK was placed in a quartz tube furnace and heated up to 1150 degrees Celsius in high purity oxygen atmosphere at a heating rate of 600 degrees Celsius per hour. It was held at that temperature for 24 hours in order to form an alumina oxide layer on the substrate surface and then slowly cooled down to room temperature at a natural cool down rate of the furnace.

After oxidizing heat treatment a 1 micrometer thick copper coating was deposited on one of the substrate faces using thermal evaporation technique. Next the substrate was placed into a quartz tube furnace and heated up to 1090 degrees C. in high purity nitrogen atmosphere at a heating rate of 600 degrees C. per hour. It was held at that temperature for 15 minutes, so that the copper layer on ceramic surface had time to melt and break down into liquid copper droplets shaped as a dome with a contact angle substantially higher than 90 degrees. Next, high purity oxygen was introduced into nitrogen gas flow entering the furnace, so that the resulting concentration of oxygen measured by an oxygen sensor was 50 ppm. Introduction of oxygen allowed for transformation of non-wetting copper dome droplets into spherical cap droplets with contact angle substantially lower than 90 degrees due to enhanced wetting forces. After 10 minutes from the introduction of oxygen into furnace atmosphere, the temperature in the furnace was ramped down from 1190 degrees C. to 1060 degrees C. at a rate of 2 degrees per minute, at which point the flow of oxygen was cut off and the furnace was left to cool down at a natural rate to room temperature under a flow of the pure nitrogen gas. After cooling down to 50 degrees C. the nitrogen flow was cut off and ceramic substrate extracted from the furnace. The substrate was checked under light optical microscope, which confirmed that solidified spherical cap microscopic copper droplets were formed all over the substrate surface. Next, a copper coating 5 micrometers thick was deposited on top of the solidified spherical cap copper droplets using thick film printing method. The commercially available copper ink used for printing contained copper powder, solvent and organic binder. An average particle size of the copper ink used for printing was 3 micrometers. No glass frit was present in the ink. Next the deposited ink was dried in an air atmosphere furnace set at 115 degrees C. for 30 minutes to evaporate ink solvent. Next the substrate was placed into a quartz tube furnace and heated up to 850 degrees C. at 600 degrees per hour heating rate. High purity nitrogen gas with addition of 6 ppm oxygen was flowing through the furnace to protect copper from any substantial oxidation and at the same time allowing to burn off the organic binder in the copper ink. The ceramic substrate was held at 850 degrees C. temperature for 30 minutes, so that the deposited copper layer sintered to the solidified spherical cap copper droplets on the substrate surface. Then the furnace was cooled down to 100 degrees C. at a natural cool down rate, while keeping the nitrogen flow through the furnace. Upon cool down the substrate was extracted from the furnace and copper metallization subjected to a tensile adhesion test. The test indicated that adhesion strength of copper metallization to ceramic varied between 30 and 50 MPa, which is much higher than tensile adhesion strength of about 10 MPa usually reported for thin film and than about 2 MPa for electroless deposition metallization methods.

EXAMPLE 2

Approximately 50 by 50 by 0.65 mm AlN substrate available commercially, with specified thermal conductivity of 170 W/mK was placed in a quartz tube furnace and heated up to 1150 degrees Celsius in high purity oxygen atmosphere at a heating rate of 600 degrees Celsius per hour. It was held at that temperature for 24 hours in order to form an alumina oxide layer on the substrate surface and then slowly cooled down to room temperature at a natural cool down rate of the furnace.

After oxidizing heat treatment one face of the substrate was subjected to kinetic spray deposition of copper layer. Deposition was carried out using 20 microns average particle size 99.9% pure copper powder and air jet at 200 degrees C.

temperature. Deposition resulted in formation of approximately 1-3 micrometers thick copper metallization layer.

Next the substrate was placed into a quartz tube furnace and heated up to 1090 degrees C. in high purity nitrogen atmosphere at a heating rate of 600 degrees C. per hour. It was held at that temperature for 15 minutes, so that the copper layer on ceramic surface had time to melt and break down into liquid copper droplets shaped as a dome with contact angle substantially higher than 90 degrees. Next, high purity oxygen was introduced into nitrogen gas stream entering the furnace, so that the resulting concentration of oxygen measured by oxygen sensor was 50 ppm. Introduction of oxygen allowed for transformation of non-wetting copper dome droplets into spherical cap droplets with contact angle substantially lower than 90 degrees due to enhanced wetting forces. After 10 minutes from the introduction of oxygen into furnace atmosphere, the temperature in the furnace was ramped down from 1190 degrees C. to 1060 degrees C. at a rate of 2 degrees per minute, at which point the flow of oxygen was cut off and the furnace was left to cool down at a natural rate to room temperature under a flow of the nitrogen gas. After cooling down to 100 degrees C. the nitrogen flow was cut off and ceramic substrate extracted from the furnace. The substrate was checked under light optical microscope, which confirmed that solidified spherical cap microscopic copper droplets were formed all over the substrate surface. Next, the substrate was subjected to kinetic spray deposition of copper layer to cover the solidified spherical cap copper droplets on the substrate surface. Deposition was carried out using 20 microns average particle size 99.9% pure copper powder and air jet at 350 degrees Celsius temperature. Deposition resulted in formation of approximately 15-20 micrometers thick copper metallization layer, which was adequate to cover the solidified spherical cap copper droplets completely. Next the substrate was placed into a quartz tube furnace and heated up to 850 degrees C. in high purity nitrogen atmosphere at a heating rate of 600 degrees C. per hour. It was held at that temperature for 30 minutes, so that the deposited copper layer sintered to the solidified copper droplets on the substrate surface that it covered. Then the furnace was cooled down to 100 degrees C. at a natural cool down rate, while keeping the nitrogen flow through the furnace. Upon cool down the substrate was extracted from the furnace and copper metallization subjected to a tensile adhesion test. The test indicated that adhesion strength of copper metallization to ceramic varied between 35 and 45 MPa, which is much higher than adhesion strength of about 10 MPa usually reported for thin film and than about 2 MPa for electroless deposition metallization methods.

Although the description above contains many specificities, these should not be construed as limiting the scope of the invention but as merely providing illustrations of some of the presently preferred embodiments of this invention.

Thus the scope of the invention should be determined by the appended claims and their legal equivalents, rather than by examples given.

I claim:

1. A process for producing a discrete metallization of a ceramic substrate surface, comprising the steps of:
    a) obtaining a substrate selected from the group consisting of oxygen-containing ceramics, and oxygen-non-containing ceramics;
    b) providing heat treatment when the substrate selected are oxygen-non-containing ceramics;
    c) forming a substantially continuous metal coating layer on the ceramic surface, using a process selected from the group consisting of physical vapor deposition, chemical vapor deposition, kinetic spraying, thermal spraying, electroless plating, electrolytic plating, thick film printing, ink jet printing, automated syringe dispensing, automated nozzle dispensing, slurry coating, slurry brushing, slurry spraying, laser cladding, and any combination of said processes; and
    d) converting the continuous metal coating layer into a multiplicity of discrete solidified droplets of the metal on the ceramic surface having a contact angle lower than ninety degrees by means of a heat treatment in a controlled gas atmosphere, wherein the heat treatment further comprises the steps of:
        heating up, in a gas atmosphere sufficiently inert not to cause substantial oxidation of the metal, the substrate with the substantially continuous metal layer to a temperature and for a time duration sufficient for the metal to transition into a liquid state and break up into a plurality of droplets on the ceramic substrate surface with a contact angle higher than ninety degrees;
        introducing a quantity of oxygen into the gas atmosphere in concentrations and for a time duration sufficient for the droplets of the liquid metal on the ceramic substrate to change shape so that the contact angle becomes lower than ninety degrees; and
        cooling down and solidifying the metal droplets on the ceramic substrate in a controlled gas atmosphere.

2. The process of claim 1, wherein the oxygen-containing ceramics are selected from the group consisting of alumina, black alumina, beryllia, silica-based glass, silica-based ceramic, zirconia, magnesia, mullite, corderite, fosterite, and wherein the oxygen-non-containing ceramics are selected from the group consisting of aluminum nitride, silicon nitride, boron nitride, silicon, silicon carbide, titanium carbide, and boron carbide.

3. The process of claim 2, wherein the metal is selected from the group consisting of copper, silver, gold, nickel, cobalt, iron, manganese, chromium, and any alloys based on these metals.

4. The process of claim 1, wherein the metal is selected from the group consisting of copper, silver, gold, nickel, cobalt, iron, manganese, chromium, and any alloys based on these metals.

5. The process of claim 1, wherein during the heat treatment of step d the heating up is in an inert gas atmosphere containing less than ten parts per million oxygen and the quantity of oxygen introduced into the gas atmosphere is in concentrations higher ten parts per million.

6. The process of claim 5, wherein the metal is selected from the group consisting of copper, and any alloys based on copper.

7. The process of claim 5, wherein the oxygen-containing ceramics are selected from the group consisting of alumina, black alumina, beryllia, silica-based glass, silica-based ceramic, zirconia, magnesia, mullite, corderite, fosterite, and wherein the oxygen-non-containing ceramics are selected from the group consisting of aluminum nitride, silicon nitride, boron nitride, silicon, silicon carbide, titanium carbide, and boron carbide.

8. The process of claim 7, wherein the metal is selected from the group consisting of copper, and any alloys based on copper.

9. A process for producing a continuous metallization of a ceramic substrate surface, the steps comprising:
    a) obtaining a substrate, wherein the substrate is selected from the group consisting of oxygen-containing ceramics, and oxygen-non-containing ceramics;

b) providing heat treatment when the substrate selected is oxygen-non-containing ceramics;
c) forming a substantially continuous coating layer of a first metal on the ceramic substrate surface, utilizing at least one process selected from the group consisting of physical vapor deposition, chemical vapor deposition, kinetic spraying, thermal spraying, electroless plating, electrolytic plating, thick film printing, ink jet printing, automated syringe dispensing, automated nozzle dispensing, slurry coating, slurry brushing, slurry spraying, laser cladding, and any combination of said processes;
d) converting the continuous first metal coating layer into a multiplicity of discrete solidified droplets of the first metal on the ceramic surface having a contact angle lower than ninety degrees by means of a heat treatment in a controlled gas atmosphere; wherein the heat treatment further comprises the steps of:
heating up, in a gas atmosphere sufficiently inert not to cause substantial oxidation of the first metal, the substrate with the substantially continuous first metal layer to a temperature and for a time duration sufficient for the first metal to transition into liquid state and break up into droplets on the ceramic substrate surface with a contact angle higher than ninety degrees;
introducing a quantity of oxygen into the gas atmosphere in concentrations and for a time duration sufficient for the droplets of the liquid first metal on the ceramic substrate to change shape so that the contact angle becomes lower than ninety degrees; and
cooling down and solidifying the first metal droplets on the ceramic substrate in a controlled gas atmosphere;
e) forming a substantially continuous coating layer of a second metal, so that the second metal coating layer physically contacts the discrete solidified droplets of the first metal, said second metal of the coating selected from the group consisting of the same metal as the first metal, and a metal different from the first metal; and
f) sintering the second metal coating layer and the solidified droplets of the first metal.

10. The process of claim 9, wherein the first and the second metals are selected from the group consisting of copper, silver, gold, nickel, cobalt, iron, manganese, chromium, and any alloys based on these metals.

11. The process of claim 9, wherein the oxygen-containing ceramics are selected from the group consisting of alumina, black alumina, beryllia, silica-based glass, silica-based ceramic, zirconia, magnesia, mullite, corderite, and fosterite, and wherein the oxygen-non-containing ceramics are selected from the group consisting of aluminum nitride, silicon nitride, boron nitride, silicon, silicon carbide, titanium carbide, and boron carbide.

12. The process of claim 11, wherein the first and the second metals are selected from the group consisting of copper, silver, gold, nickel, cobalt, iron, manganese, chromium, and any alloys based on these metals.

13. A process for producing a continuous metallization of a ceramic substrate surface, the steps comprising:
a) obtaining a substrate, wherein the substrate is selected from the group consisting of oxygen-containing ceramics, and oxygen-non-containing ceramics;
b) providing heat treatment when the substrate selected is oxygen-non-containing ceramics;
c) forming a substantially continuous coating layer of a first metal on the ceramic substrate surface, utilizing at least one process selected from the group consisting of physical vapor deposition, chemical vapor deposition, kinetic spraying, thermal spraying, electroless plating, electrolytic plating, thick film printing, ink jet printing, automated syringe dispensing, automated nozzle dispensing, slurry coating, slurry brushing, slurry spraying, laser cladding, and any combination of said processes;
d) converting the substantially continuous first metal coating layer into a multiplicity of discrete solidified droplets of the first metal on the ceramic surface having a contact angle lower than ninety degrees by means of a heat treatment in a controlled gas atmosphere; and wherein the heat treatment comprises the steps of:
heating up, in an inert gas atmosphere containing less than ten parts per million oxygen, the substrate with the substantially continuous first metal layer to a temperature higher than one thousand eighty-five degrees Celsius and for a time duration, that is sufficient for the first metal to transition into a liquid state and to break up into a plurality of droplets on the ceramic substrate surface with a contact angle higher than ninety degrees;
introducing a quantity of oxygen into the gas atmosphere in concentrations higher than ten parts per million and for a time duration, that is sufficient for the droplets of the liquid first metal on the ceramic substrate to change shape so that the contact angle becomes lower than ninety degrees; and
cooling down and solidifying the first metal droplets on the ceramic substrate in a controlled gas atmosphere;
e) forming a substantially continuous coating layer of a second metal, so that the second metal coating layer physically contacts the discrete solidified droplets of the first metal, said second metal of the coating selected from the group consisting of the same metal as the first metal, and a metal different from the first metal; and
f) sintering the second metal coating layer and the solidified droplets of the first metal.

14. The process of claim 13, wherein the first metal is selected from the group consisting of copper, and alloys based on copper, and wherein the second metal is selected from the group consisting of copper, silver, gold, nickel, cobalt, iron, manganese, chromium, and any alloys based on these metals.

15. The process of claim 13, wherein the oxygen-containing ceramics are selected from the group consisting of alumina, black alumina, beryllia, silica-based glass, silica-based ceramic, zirconia, magnesia, mullite, corderite, and fosterite, and wherein the oxygen-non-containing ceramics are selected from the group consisting of aluminum nitride, silicon nitride, boron nitride, silicon, silicon carbide, titanium carbide and boron carbide.

16. The process of claim 15, wherein the first metal is selected from the group consisting of copper, and alloys based on copper, and wherein the second metal is selected from the group consisting of copper, silver, gold, nickel, cobalt, iron, manganese, chromium, and any alloys based on these metals.

* * * * *